United States Patent [19]

Marzalek et al.

[11] Patent Number: 4,928,251
[45] Date of Patent: May 22, 1990

[54] METHOD AND APPARATUS FOR WAVEFORM RECONSTRUCTION FOR SAMPLED DATA SYSTEM

[75] Inventors: Michael S. Marzalek, Petaluma; Stephen R. Peterson, Santa Rosa, both of Calif.; John A. Wendler, Urbana, Ill.

[73] Assignee: Hewlett-Packard Company, Palo Alto, Calif.

[21] Appl. No.: 43,070

[22] Filed: Apr. 27, 1987

[51] Int. Cl.$^5$ .......................................... G01R 23/02
[52] U.S. Cl. ................................. 364/484; 324/78 R; 324/78 Q
[58] Field of Search ............... 364/484, 485, 486, 480; 324/78 R, 78 Q, 78 Z, 83 R

[56] References Cited

U.S. PATENT DOCUMENTS

| | | | |
|---|---|---|---|
| 3,766,555 | 10/1973 | Watt | 324/83 R |
| 3,881,097 | 4/1975 | Lehmann et al. | 364/485 |
| 3,932,737 | 1/1976 | Delépine | 364/484 |
| 4,090,126 | 5/1978 | Poticha et al. | 324/78 Z |
| 4,150,432 | 4/1979 | Sorden | 364/484 |
| 4,159,527 | 6/1979 | Yahata et al. | 324/83 R |
| 4,301,404 | 11/1981 | Ley | 364/484 |
| 4,408,284 | 10/1983 | Kijesky et al. | 364/485 |
| 4,523,291 | 6/1985 | Giubbolini et al. | 364/485 |
| 4,730,257 | 3/1988 | Szeto | 364/484 |

Primary Examiner—Bruce Y. Arnold
Assistant Examiner—Terry S. Callaghan
Attorney, Agent, or Firm—William C. Milks, III

[57] ABSTRACT

Representations of signal edges of a repetitive signal are sampled without triggering, then sorted out based on frequency and sequence and then superimposed along a common time base of one period in order to reconstruct a signal. In a specific embodiment of a method according to the invention, a string of samples of a repetitive, input signal with high frequency components is captured without triggering with relatively low time resolution to determine an approximate waveform from the low resolution samples, then digital signal processing techniques in the form of a fast Fourier transform are applied to a reconstructed time record of the input signal to obtain an accurate frequency for each signal component, and finally the sampled waveform is reconstructed by overlaying sampled components with reference to a common time or phase reference. The FFT is employed to determine the frequency of each signal component very accurately. Further processing, such as bin interpolation based on a window function, may be employed to improve resolution still further.

12 Claims, 4 Drawing Sheets

FIG 3A (MAX= DIFFERENCE BETWEEN MAIN LOBE HEIGHT AND HEIGHT 1 BIN AWAY)

METHOD AND APPARATUS FOR WAVEFORM RECONSTRUCTION FOR SAMPLED DATA SYSTEM

BACKGROUND OF THE INVENTION

This invention relates to sampled data signal analysis and in particular to methods and apparatus for sampling and reconstructing the wave shape of substantially non-transient data wherein processing of samples of signals occurs at a rate substantially less than the Nyquist rate of the highest frequency components of the sampled signal but higher than the Nyquist rate of the lowest frequency components. A related, but distinguishable field is that of direct measurement of signals. In that field, measurement techniques are constrained by the absolute speed limitations of the components in the system. In the present field, techniques have been developed for making measurements wherein the signal analysis components of the measurement system operate at frequencies or speeds substantially less than the frequency components of the measured signal. Such techniques are primarily employed for measurements of nontransient or slowly-changing signal components of high-frequency (e.g. microwave) steady-state signals.

In connection with the need to measure slowly-changing signal components in high-frequency, steady-state signals, such as signals above 1 GHz, there is a need to examine and record fast rise-time (or fall-time) signals. In the past, it has been necessary to provide an input signal trigger. Such a scheme may require circuitry capable of operation at speeds comparable to or better than the signal to be analyzed. Since this is not always practical, because of limitations imposed by the available analysis tools, an alternative is clearly needed to the traditional hardware-triggered sampling data capture system.

More specifically, what is desired is an ability to record for analysis fast rise-time signals with a conventional signal digitizer (which operates at a substantially lower speed than the signal to be analyzed). For example, a 20 million sample per second digitizer sampling a signal with 20·GHz components implies analysis by circuit components operating at 20 MHz upon a 1/1000th harmonic with a best resolution of 50 nanoseconds between each sample. In theory, a signal with a 50 nanosecond-range rise time waveform could be recorded for analysis. This is an extremely difficult task with a conventional digitizer employing state-of-the-art components and circuitry. In reality, a digitizer with a resolution of 50 nanoseconds can only resolve for identification purposes a signal having frequency components with a rise time of greater than about 100 nanoseconds. At best, it is possible to determine that a signal has a rise time of 50 nanoseconds, but it is not possible to determine important characteristics, including exactly when the event started or the shape of the rising signal between samples.

Random event signals are particularly difficult to analyze. Depending on the point of random sampling, one might be able to record the occurrence of an event at a mid-point between a series of samples representing stable states of a signal. If so, one would know only that an input signal experienced a transition during an interval of somewhat less than 100 nanoseconds because the signal would require a minimum period of two samples to move between stable states. Little more would be known about the signal.

It is nevertheless desirable to be able to examine in detail an event represented by an input signal whose resolution is on the order of only twenty picoseconds.

It is believed that there is no prior art directly relevant to the present invention. However, in the past, an instrument manufactured by Hewlett-Packard Company under the model designation 54100 has used random repetitive sampling whereby triggered samples of a repetitive waveform are taken every 25 nanoseconds, and a hardware trigger interpolator is employed to determine where each sample has occurred with respect to the trigger, i.e., whether it occurred before the trigger or after the trigger and by how much before or after the trigger it occurred. Based on where it occurred with respect to the trigger, a dot or sample point representing the position of the sample in a magnitude versus time relationship is directed to an output device such as a sampling oscilloscope screen or a printer, wherein the dot is stored and/or displayed as an element of a reconstructed or synthesized waveform. Due to the inherent shortcomings on the accuracy of triggering, there is a limitation on the accuracy of such a synthesized waveform at high frequencies.

SUMMARY OF THE INVENTION

A method according to the invention comprises the steps of registering a time record of a large plurality of samples of a repetitive signal, determining the frequency of the repetitive signal very precisely, sorting based on frequency and the sequence of the samples, and presenting the time record on a reconstructed common time base (one period) in order to represent the repetitive signal with a much finer resolution than would be possible for a sampling technique based on sampling a single period. The invention does not employ a circuit for triggering each sampling operation.

The invention herein described does not require triggering based on a hardware circuit. Rather, the invention relies on software reconstruction of a repetitive waveform which has been randomly sampled and then analyzed to calculate the precise frequency of the fundamental component and then from that the beginning of each cycle and then the phase of all other sampled points. This technique is limited to the analysis of a single repetitive waveform. Its reliance on so-called software triggering means eliminates the need for a high-speed triggering circuit in order to build an effective signal sampling instrument.

According to a specific embodiment of the invention, a string of samples of a repetitive, input signal with high frequency components is registered relative to an arbitrary time base for a recording time which extends over many periods of the repetitive signal. The samples are captured without triggering with relatively low time resolution to determine an approximate waveform from the low resolution samples, then digital signal processing techniques in the form of a fast Fourier transform (FFT) are applied to a reconstructed time record of the input signal to obtain an accurate frequency for the signal, and finally the sampled waveform is reconstructed by overlaying samples with reference to a common time or phase reference.

In accordance with a specific embodiment of the invention, an FFT is employed to determine the fundamental frequency of the signal component precisely. Other methods can be employed as alternatives, including for example a discrete Fourier transform (DFT) of zero crossings, a chirp transform or other time to frequency transforms. Further processing, such as bin interpolation as explained herein, is employed to improve frequency resolution. For example, if the shape of the sampling window in the time domain is known and a particular result in the frequency domain is produced, then it is possible to use interpolation to find the frequency of the input to sub-bin resolution. Thereby it is possible to overlay samples taken over multiple periods to resolve rise times that are extremely fast, e.g., as short as ten nanoseconds, and to take advantage of the entire bandwidth of the sampling system.

According to the invention, therefore, the function of the traditional trigger circuit is synthesized so that random repetitive sampling of any signal can be accomplished without reference to a triggering signal. Using sample values representing hundreds of samples of signal edges, it is possible to determine the shape of the waveform as well as its frequency to an accuracy in excess of known trigger-based sampling techniques.

The invention will be better understood by reference to the following detailed description taken in conjunction with the accompanying drawings.

DESCRIPTION OF SPECIFIC EMBODIMENTS

Figure 1:
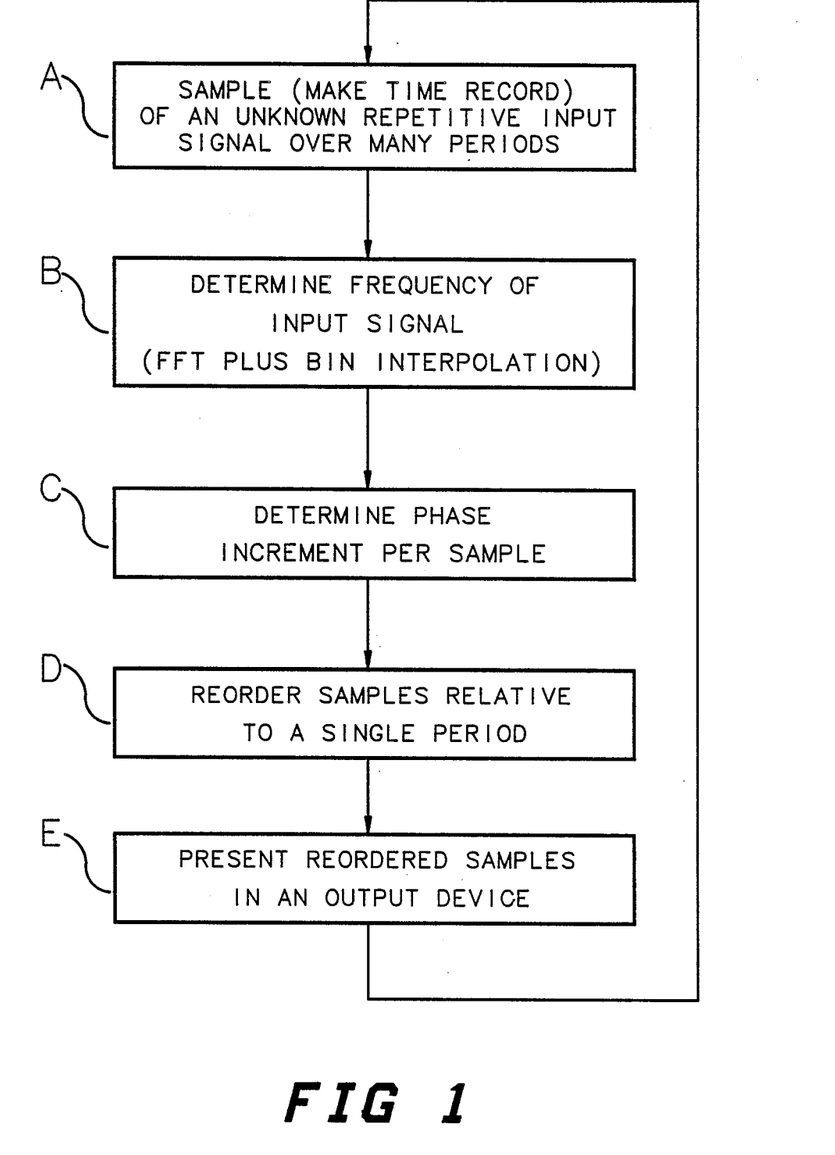
FIG. 1 is a functional block diagram of the method according to the invention.

Referring to FIG. 1, there is shown a flow chart or functional block diagram of a method in accordance with the invention. A source code listing of selected elements of the method according to the invention is contained in Appendix A attached, in which the word "bin" is replaced by the word "bucket." The source code listing is internally documented to explain the functions performed.

In FIG. 1, the following steps are repeated for each selected frame to be displayed (a frame being typically one cycle, which could be duplicated on a time axis for display purposes). First, an unknown repetitive input signal is sampled over many periods in order to make a time record of magnitude data (Step A). For example, 512, 1024 or 2048 analog values are registered with respect to an arbitrary time base (the number of values being selected for convenience of standard FFT processing techniques). The analog values are accurately recorded. However, because the sampling is essentially random with respect to the period of the sampled waveform, the recorded time of occurrence does not provide an accurate indication of the phase position of each of the recorded values relative to the actual signal. For example, the first sample may be at time T=50 nanoseconds, the second sample may be at time T=100 nanoseconds, the third sample might be at time T=150 nanoseconds, and so forth. However, no reference is made as to the position of the samples with respect to a signal phase, since the exact timing of the samples with respect to the actual signal is only within the uncertainty between sample times since sampling occurs at a rate substantially less often than the highest frequency components of the sampled signal. In this example, the uncertainty of the signal is plus or minus 50 nanoseconds.

The next step is to determine the frequency of the input signal (Step B). A very rough estimate can be determined by dividing the time of the last signal edge sensed by the number of edges detected. This form of computation is insufficiently accurate to reconstruct a sampled waveform of the input signal. In the inventive method, it is necessary that the frequency be known precisely. Otherwise, the phase position of each of the samples will be inaccurately recorded. The procedure involves the setting up of an approximate representation of the waveform, thereafter performing a time to frequency transform, such as a fast Fourier transform or discrete Fourier transform, on the results to determine the frequency of the fundamental component, then using a bin interpolation procedure (Appendix A) to make the final frequency adjustment to interpolate between two sample points in the frequency output determined by the time to frequency transform.

The next step is to determine the phase relationship of each sample or in other words to determine the position of each sample relative to all other samples as if they were taken during the same cycle in order to place each sample's amplitude in the appropriate horizontal location (Step C). One such procedure is outlined in Appendix A wherein the raw data is reread and processed in view of the determination of the fundamental frequency and the relative position in phase of each sample.

Having determined the phase position of each of the samples, the samples are then reordered relative to a single frame or display period (Step D). The display period may be one complete cycle of 360° C. phase or any fraction thereof.

Finally, the reordered samples are presented in an output device such as a CRT (Step E). If a conventional x-y display is employed, the phase positions drive the x axis and the sampled analog values drive the Y axis.

This loop is repeated for each varying frame of the sampling system.

Figure 2:
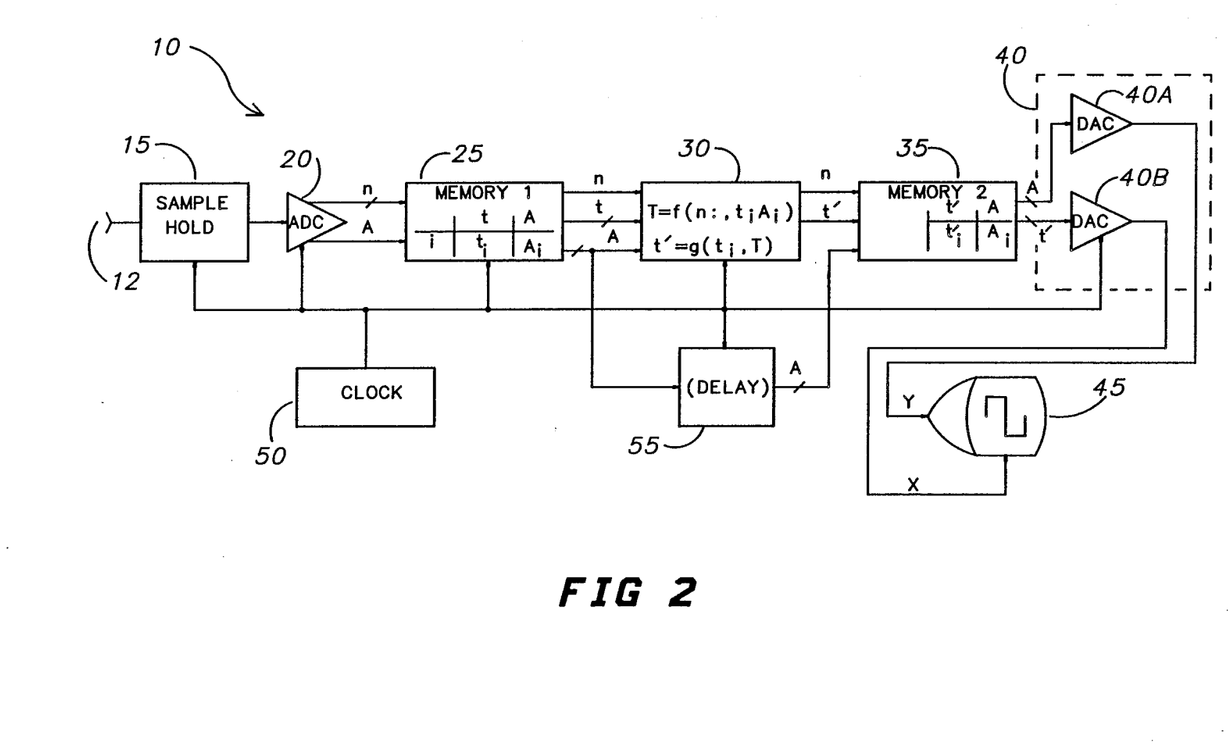
FIG. 2 is a block diagram of an apparatus according to the invention.

Referring to FIG. 2, there is shown a block diagram of a representative circuit 10 in accordance with the invention. An appropriate probe 12 receives signals which are applied to a sample and hold circuit 15 which samples at a rate determined by a clock 50. The clock 50 synchronizes all subsystems of the circuit 10. The output of the sample and hold circuit 15 is applied to an analog to digital converter 20 which loads each sampled value in an array (column) format into a first memory 25. The first memory 25 thus contains simply a table listing of the analog values in the order received with the approximate time of occurrence (within the uncertainty of the sampling system).

The values in the first memory 25 are then provided to means for computing the fundamental frequency 30. This frequency computing means 30 is explained hereinafter. The output of the frequency computing means 30 is the sample number "n" and the accurate time $t_i$ for the $i^{th}$ sample. It is supplied together with the analog values from the first memory 25 to a second memory 35.

The second memory 35 is for storing the sample values resorted in phase order, the phase having been accurately determined by the frequency computing means 30. The output of the second memory 35 is supplied to digital to analog converter means 40.

Digital to analog converter means 40 comprises a first digital to analog converter (DAC) 40A and a second digital to analog converter (DAC) 40B. The first DAC 40A reconstructs the analog values for the magnitude $A_i$ and drives the y axis input of a CRT 45 or like output device. The second DAC 40B receives the time inputs $t_i'$ and provides the corresponding analog output signals to drive the x axis input of the CRT 45. The result is a display of one frame of a repetitive waveform reconstructed from samples of many waveforms.

There are many specific structures of devices which would operate according to the invention. For example, the first memory 25 and the second memory 35 may be the same physical memory device. In other forms, each memory 25, 35 may be a shift register means or other pipeline device in which data is received at an input port and provided thereafter at an output in a continuous fashion. It is also possible that the magnitude values be stored in analog fashion as in charged coupled devices.

If it is necessary to account for delays inherent in the processing of the frequency computing means 30, a delay device 55 may be provided which inserts for the magnitude data $A_i$ an appropriate processing time delay between the first memory 25 and the second memory 35. This time delay assures synchronism between data in pipelined data paths.

Figure 4:
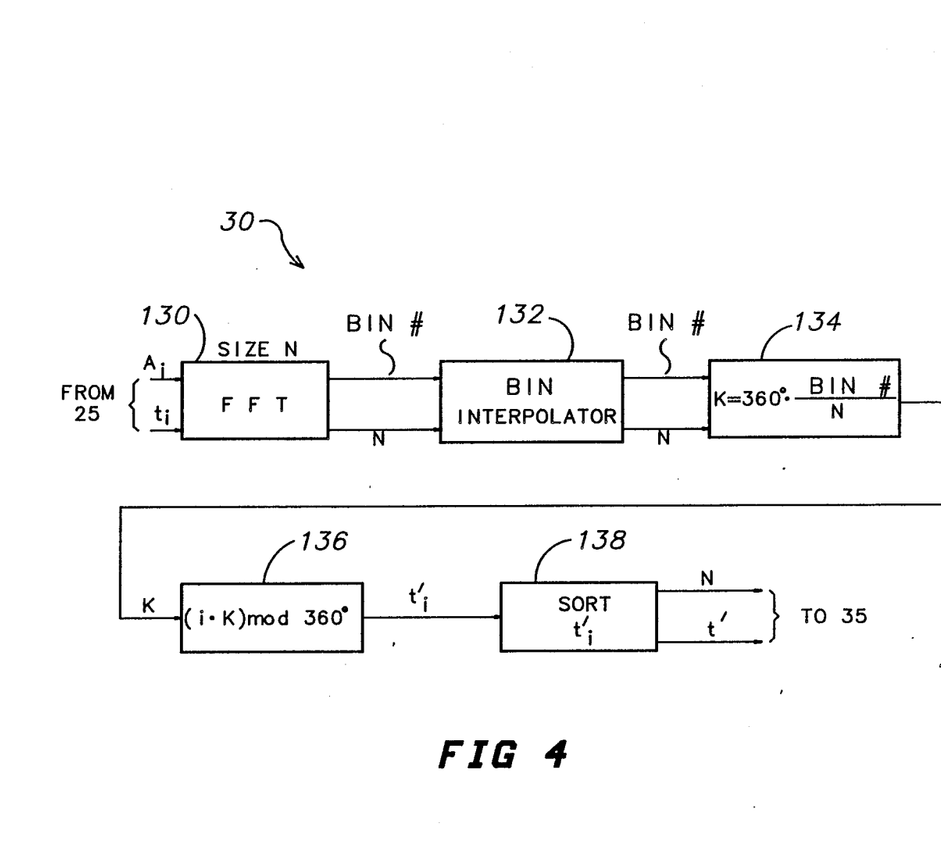
FIG. 4 is a block diagram of a specific embodiment of a frequency correction and time reordering circuit in accordance with the invention.

Referring now to FIG. 4, there is shown one specific example of a frequency computing means 30 according to the invention. The frequency computing means 30 comprises for example a fast Fourier transform processor FFT 130 coupled to a bin interpolator 132 which in turn is coupled to an index calculator 134, which in turn is coupled to a modulo calculator 136, which in turn is coupled to a time index sorter 138.

Data is received at the input of the FFT 130 from the first memory 25 in the form of the array values for magnitude $A_i$ and time $t_i$ in the order of sampling. These values are processed in segments suitable for fast Fourier transform processing, i.e., 512, 1024 or 2048 sample points. The FFT 130 provides as its output the bin number and the value N to a bin interpolator 132, which represent the frequency of the fundamental of the sampled signal within the uncertainty of a sample bin. The bucket interpolator 132 processes the result to generate a more highly resolved value for bin number and N as its output, as explained hereinafter and in Appendix A. The bin interpolator 132 in turn provides the results to the index calculator 134. The index calculator 134 is a functional unit which divides the bin number by the value N and multiplies it by a single cycle of 360° to obtain a value K. The function is thus:

$$K = (\text{BIN \#}) \times 360°/N$$

The index calculator 134 provides the value K to a modulo calculator 136. The modulo calculator recomputes the time sequence by the function:

$$t'_i = (i \times K) \bmod 360°.$$

By this function, the value $t'_i$ is determined for each magnitude value. Thereafter, all values $t'_i$ are sorted into ascending order by the sorter 138. The output of the sorter 138 is then supplied to the second memory 35.

Bin interpolation is very helpful in accurately determining a frequency derived from sampled data. It has been found for example that a fast Fourier transform when used for spectrum analysis creates a difference in magnitude between a signal that falls directly on a sampling bin versus one that falls halfway between two bins, and therefore suggestions have been made to use a correction factor to compensate for frequency and magnitude errors. The correction factor is based on a window function whereby the magnitude in adjacent bins is estimated by examination of the signal at a bin in view of the shape of the main lobe of the chosen window function.

Stated mathematically:

$$M_N = M_S - W(x)$$

$$M_{N+1} = M_S - W(1-x)$$

so x can be solved for from:

$$M_N - M_{N+1} = W(1-x) - W(x)$$

where $M_S$ is the magnitude of the signal to be estimated, $M_N$ is the magnitude at bin N, $M_{N+1}$ is the magnitude at bin N+1, and W(x) is the window response as a function of x.

The ideal window function W(x) exhibits a broad main lobe with little or no skirts. An alternative is to correct for droop within a window by examining and calculating a correction based on the two largest values in a local area within the frame of response data. From examination of these values, it is possible to correct not only the magnitude but to determine the true frequency to sub-bin precision, assuming there is only one signal within the response data.

An approximation of the window function for the Hanning window is of the form: $W(x) = a_1 x^2 + a_2 x^4$ where $a_1$ is 5.592 and $a_2$ is 0.405. Other coefficients apply to other window functions. The value of the prior and following magnitudes is a function of W(x), where x is to be solved for.

Because it is difficult to find an approximation for W(x) in the form above from known discrete magnitudes M, it is often easier to find an approximation for frequency and magnitude corrections as a function of delta M, i.e., $M_N - M_{N+1}$, by simple curve fitting to the window function. It has been determined for example that the curve fitting correction factors for frequency and magnitude for a Hanning window is as follows:

$$(\text{delta } F) = 0.500904 + 8.89781\text{E-}2(\text{delta } m) + 8.07123\text{E-}4(\text{delta } m^2)$$

$$(\text{delta } M) = 1.4191 + 0.487777(\text{delta } m) + 4.19929\text{E-}2(\text{delta } m^2)$$

Figure 3A:
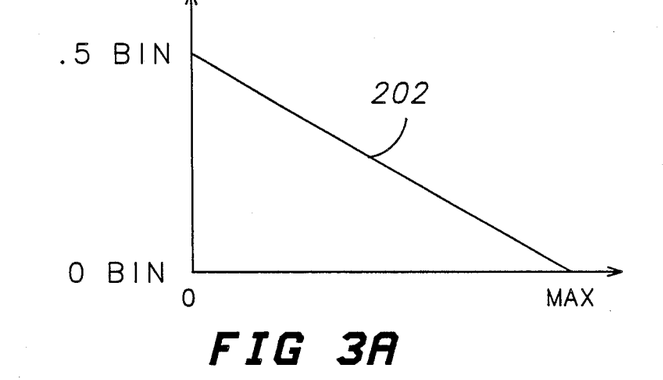
FIG. 3A is a diagram illustrating a frequency correction function useful in bin interpolation.
Figure 3B:
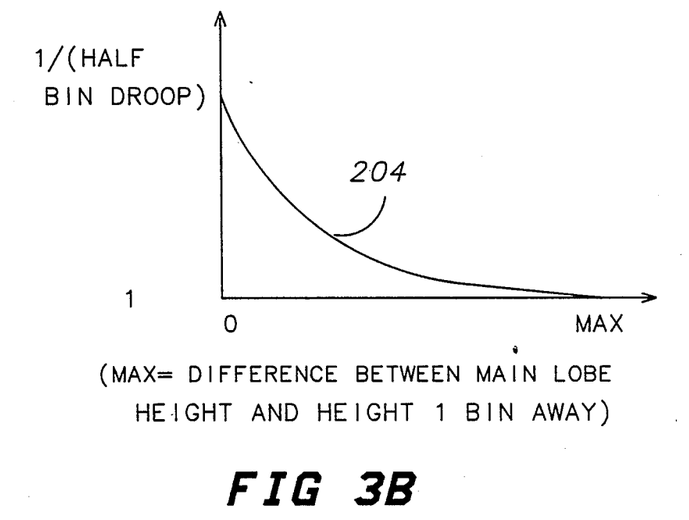
FIG. 3B is a diagram illustrating a magnitude correction function useful in bin interpolation.

Implementation of a specific embodiment of bin interpolation involves the following: First, creation of a function for magnitude correction and then the creation of a function for frequency correction. The input to both of these functions is the amplitude difference between the largest two points in a signal peak of a sampled signal. The output of both of the functions is the correction value to be applied to the larger of the two points. Since the functions are of fairly low order, these functions can be approximated by simple polynomials, such as given above. For frequency correction, the correction function 202 illustrated by FIG. 3A is preferably used. For magnitude correction, the correction function 204 illustrated by FIG. 3B is preferably used. FIG. 3A shows a correction function 202 which adds to the larger point of the pair of points in the direction toward the smaller point. In magnitude correction, as shown in FIG. 3B, the correction 204 provides that the larger point be increased by up to one-half bin droop. The position at the point labeled MAX is defined as the difference between the main lobe height and the height one bin away.

One procedure which computes frequency adjustments for two points in order to interpolate the position of the signal between them is given in Appendix A. In the embodiment of Appendix A, the window used is a Hanning window. Other window functions might be used such as the Hamming window or the ideal flattop. The interpolation equations shown in Appendix A thus are based on a simple curve fitting of several points.

This invention has now been explained with reference to specific embodiments. Other embodiments will be apparent to those of ordinary skill in this art. It is therefore not intended that the invention be limited except as indicated by the appended claims.

APPENDIX A

```
1   "68000" PREPROCESS
2   PROGRAM ADC_EFFECT;
3
4   #DEFINE RAM_CODE           1
5
6   (************************************************************)
7   (                                                            )
8   ( This file contains the routines for implementing EFFECTIVE RATE )
9   ( SAMPLING  (RANDOM REPETITIVE SAMPLING)                     )
10  (                                                            )
11  (************************************************************)
12
13  #INCLUDE DEFINE                       ( ADC definitions      )
14  #INCLUDE DEFINE2                      ( SMI definitions       )
15
16  #DEFINE PRE_PAD            2
17  #DEFINE HALF_SIZE          2
18  #DEFINE FULL_SIZE          4
19
20  (************************************************************)
21
22  VAR
23  $EXTVAR ON$
24
25  #INCLUDE VARS_0
26  #INCLUDE VARS_4
27  #INCLUDE VARS_5
28  #INCLUDE VARS_6
29  #INCLUDE VARS_7
30  #INCLUDE VARS_9
31  #INCLUDE VARS_10
32  #INCLUDE VARS_11
33  #INCLUDE VARS_13
34  #INCLUDE VARS_17
35  #INCLUDE VARS_19
36
37  Auto_level1:     SIGNED_16;
38  Auto_level3:     SIGNED_16;
39  Auto_qual:       QUALIFIER;
40
41  #IF RAM_CODE =   1
42      $BASE_PAGE$
43  #ELSE
44      $EXTVAR OFF$
45  #ENDIF
46
47  points:          SIGNED_16;
48  prepoints:       SIGNED_16;
49  pretrig:         SIGNED_16;
50  time0:           SIGNED_16;
51  filtered:        BYTE;
52
53  $EXTVAR OFF$
54  $COMMON ON$
55
56  (************************************************************)
57
58  #INCLUDE PROCEDURES
59  #INCLUDE PROC3
```

```
60 #INCLUDE PROC5
61 #INCLUDE PROC8
62 #INCLUDE PROC9
63 #INCLUDE PROC11
64 #INCLUDE PROC13
65 #INCLUDE PROC14
66 #INCLUDE PROC15
67 #INCLUDE PROC17
68
69 (****************************************************************)
70
71 FUNCTION GET_RAW_TIME: INTEGER;
72
73 VAR junk:        SIGNED_16;
74     temp:        INTEGER;
75
76 BEGIN
77     AUTO_DATA_SETUP(0,0,0,0);
78     Trace_table[CHANNEL1]._event_id:=Trace_table[CHANNEL1]._event_id + 1;
79     Trace_table[CHANNEL1]._trace_mode:=rrs_wait1;
80     Read_flag:=rrs_wait1;
81     Trace_count:=1;
82
83     READ_LOGIC(ADDR(junk));                    ( READ_LOGIC should   )
84     READ_LOGIC(ADDR(junk));                    ( only take 2 tries   )
85                                                ( to get each trigger )
86     temp:=-1;
87     IF (Trace_table[CHANNEL1]._trace_mode = auto_rrs) THEN
88         temp:=ROUND((Auto_time - Auto_lastime) / Clock_period);
89
90     GET_RAW_TIME:=temp;
91 END;
92
93 (****************************************************************)
94
95 PROCEDURE GET_RAW_DATA(VAR pntr:        POINT_16;
96                        VAR count:       SIGNED_16;
97                        skip,dupl,add:   SIGNED_16);
98
99 VAR data:       ARRAY[0..16] OF SIGNED_16;
100     j:          SIGNED_16;
101
102 BEGIN
103     Read_flag:=auto_rrs;
104     Trace_count:=points;
105     REPEAT
106        READ_LOGIC(ADDR(data));
107
108        FOR j:=1 TO data[0] DO_
109           BEGIN                                ( If skip <> 0,       )
110           IF (skip > 0) THEN                   ( skip the 1st skip   )
111              skip:=skip - 1                    ( points              )
112
113           ELSE IF (dupl > 0) THEN              ( If dupl <> 0,       )
114              BEGIN                             ( duplicate the 1st   )
115              add:=add - dupl;                  ( usable point dupl   )
116              REPEAT                            ( times               )
117                 pntr^:=data[j];
118                 pntr:=POINT_16(INTEGER(pntr) + 2);
119                 count:=count + 1;
120                 dupl:=dupl - 1;
121              UNTIL (dupl = 0);
122           END ELSE BEGIN                       ( Append the data     )
123              pntr^:=data[j];
124              pntr:=POINT_16(INTEGER(pntr) + 2);
125              count:=count + 1;
126              add:=add - 1;
127           END; (IF)
128        END; (FOR)
129
130     UNTIL (add <= 0);
131
132     count:=count + add;                        ( Remove any excess   )
133     pntr:=POINT_16(INTEGER(pntr)+SHIFT(add,1)); ( points             )
```

```
134
135     WHILE (Trace_count <> 0) DO              { Purge any left over }
136         READ_LOGIC(ADDR(data));              { data                }
137 END;
138
139 (*************************************************************)
140
141 FUNCTION INTERPOLATE(trace: POINT_32; bucket: SIGNED_16): LONGREAL;
142
143 { This procedure computes the frequency adjustments for two points  }
144 { to interpolate the position of the signal between them. The window }
145 { used must be HANNING                                              }
146 {                                                                   }
147 { The input trace must be the squared magnitude.                    }
148 {                                                                   }
149 { The frequency output is in thousandths of a bucket (.001 buckets) }
150 {                                                                   }
151 { The interpolation equations were derived by curve fitting several }
152 { points.                                                           }
153
154 VAR delta1,delta2,df:    LONGREAL;
155     m1,m2,m3,delta:      SIGNED_16;
156
157 BEGIN
158                                              { Index into the trace }
159                                              { and get magnitudes.  }
160     trace:=POINT_32(INTEGER(trace)+SHIFT(bucket,2));
161     m1:=LOG32(trace^);
162     trace:=POINT_32(INTEGER(trace)+4);
163     m2:=LOG32(trace^);
164     trace:=POINT_32(INTEGER(trace)-8);
165     m3:=LOG32(trace^);
166
167     IF (m3 > m2) THEN                        { Select the highest   }
168       BEGIN                                  { two points around    }
169         m2:=m1;                              { the selected bucket  }
170         m1:=m3;
171         bucket:=bucket-1;
172     END; {IF}
173
174     delta:=m1 - m2;                          { Find the difference  }
175     IF (delta > 0) THEN                      { in magnitude of the  }
176         delta:=-delta;                       { two points.          }
177
178     df:=0.0L0;                               { Assume correction    }
179                                              { is 0                 }
180
181     delta1:=delta;                           { Convert to dB        }
182     delta1:=0.01L0 * delta1;
183
184     delta2:=delta1 * delta1;                 { Find the difference  }
185                                              { squared.             }
186
187     IF (delta > -610) THEN
188         df:=5.00504L-1 + 8.80751L-2 * delta1 + 8.07123L-4 * delta2;
189
190     IF (m1 <= m2) THEN
191         df:=1.0L0 - df;
192
193     INTERPOLATE:=bucket + df;
194 END;
195
196 (*************************************************************)
197
198 $GLOBPROC ON$
199
200 (*************************************************************)
201
202 PROCEDURE INVOKE_EFFECTIVE;
203
204 { This procedure sets up and invokes the MULTI-SWEEP measurement for }
205 { the effective rate sampling computations.                          }
206
```

```
207 VAR range,delay:             LONGREAL;
208     n,m,junk:                SIGNED_16;
209     old_enable:              BYTE;
210
211 BEGIN
212     Autotrig_count:=0;
213     SMI_UPDATE;                                      { Update parameters      }
214
215     range:=10.0L0 * Time_division;                   { Find trace time        }
216
217     delay:=0.5L0 * range * Delay_position;           { Find trigger delay     }
218     delay:=delay - Trigger_delay;                    { with respect to the    }
219                                                      { left edge of the       }
220                                                      { screeen                }
221
222     IF (delay < 0.0L0) THEN                          { Limit trigger delay    }
223         delay:=0.0L0;
224     IF (delay > range) THEN
225         delay:=range;
226
227     prepoints:=Next_pretrigger;                      { # points pretrigger    }
228
229     pretrig:=delay / Clock_period;                   { Determine size of      }
230     points:=range / Clock_period;                    { measurement. Must      }
231     time0:=pretrig;                                  { have at least 10       }
232     IF (pretrig < HALF_SIZE) THEN                    { points centered on     }
233         BEGIN                                        { the trigger            }
234         points:=points + HALF_SIZE - pretrig;
235         pretrig:=HALF_SIZE;
236     END; (IF)
237     IF (points - pretrig < HALF_SIZE) THEN
238         points:=pretrig + HALF_SIZE;
239     pretrig:=pretrig + 1 + PRE_PAD;
240     points:=points + 3 + PRE_PAD;
241     time0:=time0 - pretrig + 1;
242
243     Next_period1:=Clock_period;                      { Modify values set by   }
244     Next_quantity:=points;                           { SMI_UPDATE             }
245     Next_pretrigger:=pretrig;
246     old_enable:=Interp_enable;
247     Interp_enable:=0;
249     PREPARE_AUTO(True);                              { Prepare a multi-sweep}
250
251     WITH Trace_table[CHANNEL1] DO                    { Make sure the trace    }
252         BEGIN                                        { table has the current}
253         _time_range1:=range;                         { definition of the      }
254         _time_range2:=range;                         { measurement            }
255         _start_time:=-delay;
256         _switch_time:=1.0L6;
257         _magnify:=Off;
258         _magnify_skip:=0;
259         _magnify_size:=Trace_length;
260         _data_size:=Trace_length;
261         _out_size:=Trace_length;
262         _display_size:=Trace_length;
263     END; (WITH)
264
265     Interp_enable:=old_enable;
266     Trigger_event:=1;
267     Trigger_time:=-1.0L0;
268     Run_status:=Run_status+BINARY_BYTE[STATUS_RANDOM];
269
270
271     filtered:=False;
272     IF (Interp_enable > 1) THEN                      { If video filtering     }
273         BEGIN                                        { is enabled:            }
274         junk:=RATIO(300.0L6*range/Trace_length,n,m);{ create a gaussian or }
275         IF (m >= n) THEN                             { brickwall FIR.         }
276             SETUP_FIR(16,15,1,1,Interp_enable,-20) { Brick:  ~ 150 MHz     }
277         ELSE                                         { Gauss: 20dB @ 150 MHz}
278             SETUP_FIR(n,m,1,1,Interp_enable,-20);
279         filtered:=True;
280     END; (IF)
```

```
281 END;
282
283 (*******************************************************************)
284
285 FUNCTION COMPUTE_EFFECTIVE(size: SIGNED_16): SIGNED_16;
286
287 ( This procedure is call after the multi-sweep measurement is finished.)
288 ( It massages the data from the measurement to create a single waveform)
289 ( for effective rate sampling.                                         )
290 (                                                                     )
291 ( The basic sequence is:                                              )
292 ( 0) set up the appropriate tables/states                             )
293 ( 1) determine the min/max time between any pair of triggers          )
294 ( 2) put the ADC data into an array, lopping off a constant amount of )
295 (    time between triggers (most of the "lopping" in done by the      )
296 (    hardware - this just finishes it off). If the time between trigger)
297 (    events is small enough, a continuous time record is created.     )
298 ( 3) FFT the results                                                  )
299 ( 4) Find the fundamental frequency                                   )
300 ( 5) Re-read the raw data. For each point compute it's "real"         )
301 (    position and place it in the appropriate waveform bucket.        )
302 ( 6) Fill in any "missed" buckets via linear interpolation            )
303 ( 7) Perform any filtering required/desired                           )
304 ( 8) Perform video triggering to locate the trigger event             )
305
306 LABEL                       1;
307
308 VAR mintime,maxtime,delta:INTEGER;
309     aborted,old_wait:       BYTE;
310     count,temp,j,k,m:       SIGNED_16;
311     max_freq,add,event:     SIGNED_16;
312     skip,back,margin:       SIGNED_16;
313     value1,value2:          SIGNED_16;
314     data:                   ARRAY[0..16] OF SIGNED_16;
315     max_ampl,elapsed,pad:   INTEGER;
316     pntr1:                  POINT_16;
317     pntr2:                  POINT_32;
318     bucket,dt,sum:          LONGREAL;
319     scale:                  LONGREAL;
320
321 BEGIN                                          (********************)
322     old_wait:=Wait_request;                    ( Tell processing to )
323     Wait_request:=1;                           ( ignore controller  )
324
325     STATUS_MESSAGE("Computing 1");             (********* 0 ********)
326     RESET_AUTO_READ;
327     Trace_table[CHANNEL1]._trace_mode:=auto_wait1;
328     GET_READY(CHANNEL1,0,4095,Trace_table[CHANNEL1]._data_size);
329     ABORT_TRACE_READ;
330     aborted:=True;
367     Trace_table[CHANNEL1]._event_id:=0;        ( Throw away 1st     )
368     delta:=GET_RAW_TIME;                       ( trigger            )
369
370     pntr1:=ADDR(Workspace._real_array);
371     count:=0;
372
373     IF (mintime > FULL_SIZE) THEN_
374         BEGIN              ( Get FULL_SIZE points of data from each   )
375                            ( trigger event. Pad the data so the time  )
376                            ( between each trigger is the same. There  )
377                            ( are always HALF_SIZE points of data after )
378         delta:=GET_RAW_TIME;( the last trigger added.                  )
379         WHILE (count < 1025) DO_
380             BEGIN
381
382             pad:=delta - mintime;              ( Compute the number of)
383             add:=FULL_SIZE + pad;              ( points for this event)
384
385                            ( There are pretrig-HALF_SIZE points of    )
386                            ( "padding" in the data, if the adjustment is)
387                            ( less than this, data is taken away. Other- )
388                            ( wise the first point is replicated.        )
389         skip:=pad - pretrig + HALF_SIZE;
```

```
390         IF (skip <= 0) THEN                     { Read raw data, skip  }
391                                                 { 1st -skip points    }
392             GET_RAW_DATA(pntr1,count,-skip,0,add)
393
394         ELSE IF (skip + count <= 1024) THEN     { Read raw data, dupl }
395             GET_RAW_DATA(pntr1,count,0,skip,add)
396
397         ELSE BEGIN
398             pntr1:=POINT_16(INTEGER(pntr1)-2);  { Replicate the prev  }
399             temp:=pntr1^;                       { point until memory  }
400             REPEAT                              { is full             }
401                 pntr1:=POINT_16(INTEGER(pntr1) + 2);
402                 pntr1^:=temp;
403                 count:=count + 1;
404             UNTIL (count >= 1024);
405
406         END; {IF}
407
408         delta:=GET_RAW_TIME;
409     END; {WHILE}
410
411 END ELSE_ (mintime <= FULL_SIZE) BEGIN
412                         { Since some/all of the records have           }
413                         { overlapping time, just create a continuous   }
414                         { time record (i.e. undo REC). In the cases    }
415                         { where the time records do not overlap, just  }
416                         { duplicate the 1st point the appropriate      }
417                         { number of times                              }
418     mintime:=FULL_SIZE;
419     delta:=GET_RAW_TIME;
420     WHILE (delta > 0) AND (count < 1025) DO
421         BEGIN
422         skip:=pretrig - delta + HALF_SIZE;      { Determine how much   }
423         pad:=0;                                 { (if any) data is to  }
424                                                 { be skipped/dupped    }
425
426                                                 { Always add HALF_SIZE }
427         add:=pretrig - skip + HALF_SIZE;        { points after the trig}
428
429         IF (skip < 0) THEN
430             BEGIN
431             pad:=-skip;
432             skip:=0;
433         END; {IF}
434
435         GET_RAW_DATA(pntr1,count,skip,pad,add);
436
437         delta:=GET_RAW_TIME;
438     END; {WHILE}
439
440 END; {IF}
441
442 STATUS_MESSAGE("Computing 3");
443 IF (ABORT_CHECK = True) THEN                    { Any key or RPG action}
444     GOTO_ 1;                                    { aborts processing    }
445
446                                                 {********* 3 **********}
447 temp:=EXECUTE_FFT(False,1,1024,4096,False);     { FFT. The result is   }
448                                                 { a logged magnitude   }
449                                                 { response             }
450
451                                                 {********* 4 **********}
452                                                 { Search for the peak  }
453 max_ampl:=-7FFFFFFFH;                           { (e.g. fundamental)   }
454 pntr2:=POINT_32(INTEGER(ADDR(Workspace._real_array)) + 20);
455 FOR j:=5 TO 511 DO
456     BEGIN
457     IF (pntr2^ > max_ampl) THEN
458         BEGIN
459         max_ampl:=pntr2^;
460         max_freq:=j;
461     END; {IF}
462     pntr2:=POINT_32(INTEGER(pntr2) + 4);
463 END; {FOR}
```

```
464
465     bucket:=INTERPOLATE(POINT_32(Complex.real),max_freq);
466     rrs_period:=1024.0L0 / bucket;
467     delta:=ROUND(rrs_period);                           { If period is too       }
468     IF (ABS(rrs_period - delta) < 0.02L0) THEN          { close to a multiple    }
469        BEGIN                                            { of the clock, abort    }
470        REPORT_ERROR(SUBMULT_SIGNAL);
471        GOTO_ 1;
472     END; (IF)
473     rrs_period:=(rrs_period + mintime - FULL_SIZE) * Clock_period;
474
475     STATUS_MESSAGE("Computing 4");
476     IF (ABORT_CHECK = True) THEN                        { Any key or RPG action}
477        GOTO_ 1;                                         { aborts processing     }
478
479                                                         {********* 5 **********}
480     FOR j:=0 TO 1024 DO                                 { Clear the result      }
481        BEGIN
482        Workspace._real_array[j]:=0;
483        Workspace._imag_array[j]:=0;
484     END; (FOR)
485
486     Trace_table[CHANNEL1]._event_id:=0;                 { Throw away 1st        }
487     delta:=GET_RAW_TIME;                                { trigger               }
488
489                                                         { Initialize --------   }
490                                                         { offset index to get   }
491     dt:=rrs_period / Clock_period;                      { as much data as poss  }
492                                                         { either side of meas.  }
493     margin:=512-SHIFT(size,-1);
494     scale:=size * Clock_period / Trace_table[CHANNEL1]._time_range;
495
496     event:=1;
497     Trace_table[CHANNEL1]._event_id:=1;
498     delta:=GET_RAW_TIME;
499     sum:=time0;
500     REPEAT                                              { Re-read the time      }
501                                                         { data and construct    }
502        bucket:=ROUND(scale * sum);                      { the waveform          }
503        Read_flag:=auto_rrs;
504        Trace_count:=points;
505        data[0]:=0;
506
507        IF (ABORT_CHECK = True) THEN                     { Any key or RPG action}
508           GOTO_ 1;                                      { aborts processing     }
509
510        FOR j:=0 TO points-1 DO_
511           BEGIN
512           WHILE (data[0] <= 0) DO
513              BEGIN
514              READ_LOGIC(ADDR(data));
515              k:=1;
516           END; (WHILE)
517
518           m:=bucket;
519           m:=m + margin;
520
521           IF (m >=0) (AND) THEN_
522           IF (m <= 1024)   THEN_
523              BEGIN
524              count:=Workspace._imag_array[m];
525              Workspace._real_array[m]:=AVERAGE(Workspace._real_array[m],dat
526              Workspace._imag_array[m]:=count + 1;
527           END; (IF)
528
529           k:=k+1;
530           data[0]:=data[0] - 1;
531           bucket:=bucket + scale;
532        END; (FOR)
533
534        event:=event + 1;
535        Trace_table[CHANNEL1]._event_id:=event;
536        delta:=GET_RAW_TIME;
537        sum:=sum - dt + delta;
538     UNTIL (delta <_0)_OR_(event_> 200);
```

```
540   STATUS_MESSAGE("Computing 5");              {********* 6 **********}
541   k:=-1;                                      { Search for "empty"    }
542   skip:=scale;                                { buckets. Determine    }
543   skip:=margin - skip;                        { the range to search   }
544   IF (skip < 0) THEN                          { taking into acount    }
545      skip:=0;                                 { the excess data req   }
546   count:=1152 - skip;                         { by the video filter   }
547   IF (count > 1024) THEN
548      count:=1024;
549   j:=skip;
550   REPEAT
551      IF (Workspace._imag_array[j] <> 0) THEN
552         k:=j
553      ELSE_ BEGIN                              { If found empty bucket}
554         m:=j;                                 { Find the next non-   }
555         REPEAT                                { zero bucket          }
556            m:=m+1;
557         UNTIL (m > 1023) OR (Workspace._imag_array[m] <> 0);
558
559         IF (m <= 1023) {AND} THEN_            { Perform a linear     }
560         IF (k >= 0)          THEN_            { interpolation to fill}
561         BEGIN                                 { in empty buckets     }
562            value1:=Workspace._real_array[k];
563            value2:=Workspace._real_array[m];
564            FOR j:=k+1 TO m-1 DO
565               BEGIN
566                  delta:=(value2 - value1) * (j - k);
567                  Workspace._real_array[j]:=value1 + delta / (m - k);
568               END; {IF}
569            k:=m;
570            j:=m;
571         END; {IF}
572      END; {IF}
573      j:=j + 1;
574   UNTIL (j >= count);
575
576   STATUS_MESSAGE("Computing 6");              {********* 7 **********}
577   count:=0;                                   { Apply FIR to data    }
578   IF (filtered = True) THEN
579      BEGIN
580      skip:=skip - 128; (max FIR size)
581      IF (skip < 0) THEN
582         skip:=0;
583      pntr1:=ADDR(Workspace._real_array[skip]);
584      count:=CONVOLVE(pntr1,pntr1,1024 - skip);
585      END; {IF}
586
587                                               {********* 8 **********}
588                                               { video triggering     }
589
590   temp:=time0 + pretrig - 2;                  { Start video search   }
591   j:=scale * temp;                            { 50 nS before the     }
592   j:=j + margin - count;                      { "expected" trigger   }
593                                               { position             }
594
595   k:=-1;
596
597   value1:=Translate[Auto_level1];             { Change trigger values}
598   value2:=Translate[Auto_level3];             { to user specified    }
599                                               { range.               }
600
601   IF (Auto_qual = rising_edge) THEN_
602      BEGIN
603      WHILE (j < 1023) AND
604            (Workspace._real_array[j] > value2) DO
605         j:=j + 1;
606      WHILE (j < 1023) DO
607         BEGIN
608         IF (Workspace._real_array[j] > value1) THEN
609            BEGIN
610            k:=j - prepoints;
611            j:=1024;
612            END; {IF}
613         j:=j + 1;
```

```
614       END; (WHILE)
615   END ELSE_ BEGIN
616       WHILE (j < 1023) AND
617             (Workspace._real_array[j] < value2) DO
618           j:=j + 1;
619       WHILE (j < 1023) DO
620         BEGIN
621           IF (Workspace._real_array[j] < value1) THEN
622             BEGIN
623               k:=j - prepoints;
624               j:=1024;
625             END; (IF)
626           j:=j+1;
627         END; (WHILE)
628   END; (IF)
629
630   IF (k >= prepoints) (AND) THEN            ( Determine if found    )
631   IF (k <= 1024 - size)      THEN           ( a reasonable trigger  )
632      margin:=k;                             ( point                 )
633
                                               (********* 8 **********)
587                                            ( video triggering      )
588
589
590   temp:=time0 + pretrig - 2;                ( Start video search    )
591   j:=scale * temp;                          ( 50 nS before the      )
592   j:=j + margin - count;                    ( "expected" trigger    )
593                                             ( position              )
594
595   k:=-1;
596
597   value1:=Translate[Auto_level1];           ( Change trigger values)
598   value2:=Translate[Auto_level3];           ( to user specified    )
599                                             ( range.                )
600
601   IF (Auto_qual = rising_edge) THEN_
602     BEGIN
603       WHILE (j < 1023) AND
604             (Workspace._real_array[j] > value2) DO
605           j:=j + 1;
606       WHILE (j < 1023) DO
607         BEGIN
608           IF (Workspace._real_array[j] > value1) THEN
609             BEGIN
610               k:=j - prepoints;
611               j:=1024;
612             END; (IF)
613           j:=j + 1;
614         END; (WHILE)
615   END ELSE_ BEGIN
616       WHILE (j < 1023) AND
617             (Workspace._real_array[j] < value2) DO
618           j:=j + 1;
619       WHILE (j < 1023) DO
620         BEGIN
621           IF (Workspace._real_array[j] < value1) THEN
622             BEGIN
623               k:=j - prepoints;
624               j:=1024;
625             END; (IF)
626           j:=j+1;
627         END; (WHILE)
628   END; (IF)
629
630   IF (k >= prepoints) (AND) THEN            ( Determine if found    )
631   IF (k <= 1024 - size)      THEN           ( a reasonable trigger  )
632      margin:=k;                             ( point                 )
633
634                                             (**********************)
635                                             ( Move the results to  )
636   FOR j:=0 TO size DO                       ( Workspace[0]         )
637       Workspace._real_array[j]:=Workspace._real_array[j + margin];
638   aborted:=False;
639
640
```

```
641  1;                                              (*********************)
642     Work_trace:=CHANNEL1;
643     IF (aborted = True) THEN
644        FOR j:=0 TO size DO
645           Workspace._real_array[j]:=0;
646                                                  (********* ? *********)
647     Read_flag:=idle;                             ( Clean up            )
648     Update_flags:=Update_flags+BINARY_WORD[NEW_LENGTH];
649     Run_status:=Run_status-BINARY_BYTE[STATUS_RANDOM];
650     old_status:=[];
651     Wait_request:=old_wait;
652     COMPUTE_EFFECTIVE:=size;
653 END;
654
655 (******************************************************************)
656 .
```

We claim:

1. A signal analysis method for a repetitive input signal comprising the steps of:
   generating a clock signal;
   sampling said repetitive input signal in accordance with said clock signal without reference to triggering indicia of said repetitive input signal in order to obtain signal representations;
   determining the fundamental frequency of said repetitive input signal from said signal representations;
   determining phase information for each of said signal representations relative to a reference phase of said repetitive input signal;
   sorting said signal representations according to phase relative to said reference phase of said repetitive input signal to obtain sorted signal representations; and
   presenting said sorted signal representations to an output device relative to said reference phase thereby to reconstruct an image of said signal waveform.

2. The method according to claim 1 wherein said frequency determining step comprises calculating by means of a fast Fourier transform the frequency of the fundamental component of said signal representations within resolution of one sampling bin.

3. The method according to claim 2 wherein said frequency determining step further comprises interpolating by bin interpolation between values of two sampling bins to obtain a corrected frequency and a corrected magnitude corresponding to said corrected frequency for said signal representations.

4. The method according to claim 1 wherein said frequency determining step comprises calculating by means of a discrete Fourier transform the frequency of the fundamental component of said signal representations within resolution of one sampling bin.

5. The method according to claim 1 wherein said frequency determining step further comprises interpolating by bin interpolation between values of two sampling bins to obtain a corrected frequency and a corrected magnitude corresponding to said corrected frequency for said signal representations.

6. The method according to claim 5 wherein said frequency determining step further comprises bin interpolation wherein the difference between the magnitudes of the two highest magnitude points in a window is provided as input to a frequency correction function and to a magnitude correction function and wherein the output of both said frequency correction function and said magnitude correction function is applied as a correction value to the largest of said two points.

7. The method according to claim 6 wherein said correction functions are of low order and are approximated by simple polynomials.

8. The method according to claim 5 wherein said frequency determining step further includes calculating the phase increment between each of said signal representations modulo 360°.

9. A signal analysis apparatus for a repetitive input signal comprising:
   means for sampling said repetitive input signal in accordance with a clock signal without reference to triggering indicia of said repetitive input signal in order to obtain signal representations;
   means for determining the fundamental frequency of said repetitive input signal from said signal representations;
   means for determining phase information for each of said signal representations relative to a reference phase of said repetitive input signal;
   means for sorting said signal representations according to phase relative to said reference phase of said repetitive input signal in order to obtain sorted signal representations; and
   means for presenting said sorted signal representations to an output device relative to said reference phase thereby to reconstruct an image of said signal waveform.

10. The apparatus according to claim 9 wherein said frequency determining means comprises means for calculating by a fast Fourier transform precise frequency of the fundamental component of said signal representations within resolution of one sampling bucket.

11. The apparatus according to claim 10 wherein said frequency determining means further comprises means for interpolating by bin interpolation between values of two sampling bins to obtain a corrected frequency and a corrected magnitude corresponding to said corrected frequency for said signal representations.

12. The apparatus according to claim 11 wherein said phase determining means further includes means for calculating the phase increment of each one of said signal representations modulo 360°.

* * * * *

UNITED STATES PATENT AND TRADEMARK OFFICE
CERTIFICATE OF CORRECTION

PATENT NO. : 4,928,251

DATED : May 22, 1990

INVENTOR(S) : Michael S. Marzalek, Stephen R. Peterson, and John A. Wendler

It is certified that error appears in the above-identified patent and that said Letters Patent is hereby corrected as shown below:

Column 5, Line 45, "bucket interpolator" should read -- bin interpolator --;

Signed and Sealed this

Twentieth Day of August, 1991

Attest:

Attesting Officer

HARRY F. MANBECK, JR.

Commissioner of Patents and Trademarks